(12) United States Patent
Miao et al.

(10) Patent No.: US 11,056,644 B2
(45) Date of Patent: Jul. 6, 2021

(54) PHASE-CHANGE MEMORY CELL WITH VANADIUM OXIDE BASED SWITCHING LAYER

(71) Applicant: Huazhong University of Science and Technology, Wuhan (CN)

(72) Inventors: Xiangshui Miao, Wuhan (CN); Hao Tong, Wuhan (CN); Lifan Ma, Wuhan (CN)

(73) Assignee: HUAZHONG UNIVERSITY OF SCIENCE AND TECHNOLOGY, Hubei (CN)

(*) Notice: Subject to any disclaimer, the term of this patent is extended or adjusted under 35 U.S.C. 154(b) by 0 days.

(21) Appl. No.: 16/679,355

(22) Filed: Nov. 11, 2019

(65) Prior Publication Data

US 2020/0075848 A1 Mar. 5, 2020

Related U.S. Application Data

(63) Continuation-in-part of application No. PCT/CN2018/085935, filed on May 8, 2018.

(30) Foreign Application Priority Data

May 12, 2017 (CN) .......................... 201710332675.X

(51) Int. Cl.
*G11C 11/00* (2006.01)
*H01L 45/00* (2006.01)
*G11C 13/00* (2006.01)

(52) U.S. Cl.
CPC ........ *H01L 45/065* (2013.01); *G11C 13/0004* (2013.01); *G11C 13/0069* (2013.01); *G11C 13/0097* (2013.01); *H01L 45/146* (2013.01); *H01L 45/1625* (2013.01); *G11C 2013/0092* (2013.01); *G11C 2213/15* (2013.01); *G11C 2213/52* (2013.01); *G11C 2213/73* (2013.01); *H01L 45/1233* (2013.01); *H01L 45/1253* (2013.01); *H01L 45/143* (2013.01); *H01L 45/144* (2013.01)

(58) Field of Classification Search
CPC . H01L 45/065; H01L 45/146; H01L 45/1625; H01L 45/1233; H01L 45/1253; H01L 45/143; H01L 45/144; H01L 45/1641; G11C 13/0004; G11C 13/0069; G11C 13/0097; G11C 2013/0092; G11C 2213/15; G11C 2213/52; G11C 2213/73
USPC .......................................................... 365/163
See application file for complete search history.

(56) References Cited

U.S. PATENT DOCUMENTS 10,177,310 B2 * 1/2019 Gibson ............... H01L 27/2463
10,283,707 B2 * 5/2019 Kamata ............... H01L 45/1233

* cited by examiner

*Primary Examiner* — Tha-O H Bui
(74) *Attorney, Agent, or Firm* — JCIPRNET

(57) ABSTRACT

A phase-change memory cell, including, in sequence in the following order: a first electrode layer, a switching layer comprising vanadium oxide ($VO_x$) material, a phase-change material layer, and a second electrode layer, is provided. The switching layer is adapted to control the phase-change material layer to switch between a crystalline state and an amorphous state when a voltage is applied to the first electrode layer and the second electrode layer.

20 Claims, 8 Drawing Sheets

PHASE-CHANGE MEMORY CELL WITH VANADIUM OXIDE BASED SWITCHING LAYER

CROSS-REFERENCE TO RELAYED APPLICATIONS

This application is a continuation-in-part of International Patent Application No. PCT/CN2018/085935 with an international filing date of May 8, 2018, designating the United States, and further claims foreign priority benefits to Chinese Patent Application No. 201710332675.X filed May 12, 2017. The contents of all of the aforementioned applications, including any intervening amendments thereto, are incorporated herein by reference. Inquiries from the public to applicants or assignees concerning this document or the related applications should be directed to: Matthias Scholl P C., Attn.: Dr. Matthias Scholl Esq., 245 First Street, 18th Floor, Cambridge, Mass. 02142.

BACKGROUND

The disclosure relates to the field of semiconductor memory, and more particularly to a phase-change memory cell comprising a vanadium oxide ($VO_x$)-based switching layer.

Phase-change memory (PCM) is a non-volatile random-access memory. PCM has the ability to achieve a number of distinct intermediary states and to hold multiple bits in a single cell. But the difficulties in programming PCMs have prevented these capabilities from being implemented with the same capability in other technologies, most notably flash memory.

FIG. 1 is a conventional 1T1R structure including a phase-change resistor 5 and a transistor 6 connected in series. In general, the transistor is a Metal-Oxide-Semiconductor Field Effect Transistor (MOSFET) or a Bipolar Junction Transistor (BJT). Limited by the cell area of the MOSFET or BJT, the storage density of conventional memory cells leaves much to desired.

SUMMARY

The disclosure provides a phase-change memory cell comprising vanadium oxide ($VO_x$).

The disclose provides a phase-change memory cell, comprising, in sequence in the following order: a first electrode layer, a switching layer comprising vanadium oxide ($VO_x$) material, a phase-change material layer, and a second electrode layer; when a voltage is applied to the first electrode layer and the second electrode layer, the switching layer is adapted to control the phase-change material layer to switch between in a crystalline state and in an amorphous state.

The phase-change material layer comprises a compound selected from GeTe, SbTe, BiTe, SnTe, AsTe, GeSe, SbSe, BiSe, SnSe, AsSe, InSe, GeSbTe, and AgInSbTe, or a mixture of the compound and a dopant selected from S, N, O, Cu, Si and Au.

The first electrode layer and the second electrode layer comprise TiW, Pt, Au, W or an inert electrode.

The value of X of the $VO_x$ material ranges from 1.9 to 2.1.

The threshold voltage Vth of the switching layer is less than the phase transition voltage $V_{set}$ of the phase-change material layer.

The area of the switching layer is 100 nm²-30 μm².

The insulation resistance of the $VO_x$ material of the switching layer is greater than the resistance thereof in the metallic state, and the ratio of the insulation resistance to the resistance in the metallic state is greater than 100.

The disclosure also provides an operation method of the phase-change memory cell, the method comprising the following steps:

1) applying an electric pulse greater than the threshold voltage $V_{th}$ of the switching layer between the first electrode layer and the second electrode layer, so that the temperature of the switching layer rises to be higher than its phase transition temperature, and the $VO_x$ material switches from a monoclinic crystal system in the insulating state to a tetragonal crystal system in the metallic state;

2) applying an electric pulse less than the holding voltage $V_{hold}$ of the switching layer between the first electrode layer and the second electrode layer, so that the temperature of the switching layer decreases to be lower than its phase transition temperature, and the $VO_x$ material returns to the monoclinic crystal system;

3) applying a resetting pulse having a voltage greater than a write operation threshold voltage $V_{Reset}$ and a falling edge of 10 ns between the first electrode layer and the second electrode layer, so that the temperature of the phase-change material layer rises beyond the melting temperature, the long-range order of the crystalline state is destroyed, and the phase-change material rapidly cools down below the crystallization temperature under the falling edge; there is no time for the phase-change material to crystallize; the phase-change material is in an amorphous state, and the phase-change material layer is in a low resistance state, to achieve a write operation; and 4. applying a setting pulse having a voltage between the phase transition voltage $V_{set}$ of the phase-change material layer and the write operation threshold voltage $V_{Reset}$ and a pulse width of 200 ns between the first electrode layer and the second electrode layer, so that the temperature of the phase-change material rises between the crystallization temperature and the melting temperature for 200 ns to ensure the crystallization of the phase-change material; the phase-change material changes from an amorphous state to a crystalline state, and the phase-change material layer is in a high resistance state, to achieve an erase operation.

The threshold voltage of the switching layer is less than the phase transition voltage $V_{Set}$ of the phase-change cell.

The disclosure also provides a method for preparing the switching layer of the phase-change memory cell, the method comprising: forming a layer of vanadium oxide by ion beam sputtering or magnetron sputtering, annealing the material in the nitrogen or argon atmosphere, and then cooling to room temperature to obtain the switching layer.

Advantages of the phase-change memory cell according to embodiments of the disclosure are summarized as follows. The phase-change memory cell comprises a $VO_x$-based switching layer. The $VO_x$ material has metal-insulator transition (MIT) characteristics and thus can switch between in a high resistance state and in a low resistance state under the action of an external voltage. The switching layer is adapted to control the phase-change material layer to switch between in a crystalline state and in an amorphous state without thermal treatment. The $VO_x$ material can provide an on-state current density of up to $10^6$ A/cm² and the switching time is less than 20 ns.

The preparation of the switching layer comprises sputtering and annealing and is performed in a relatively low temperature, which is conducive to the 3D stacking of memory cells and achieving high-density storage.

Figure 1:
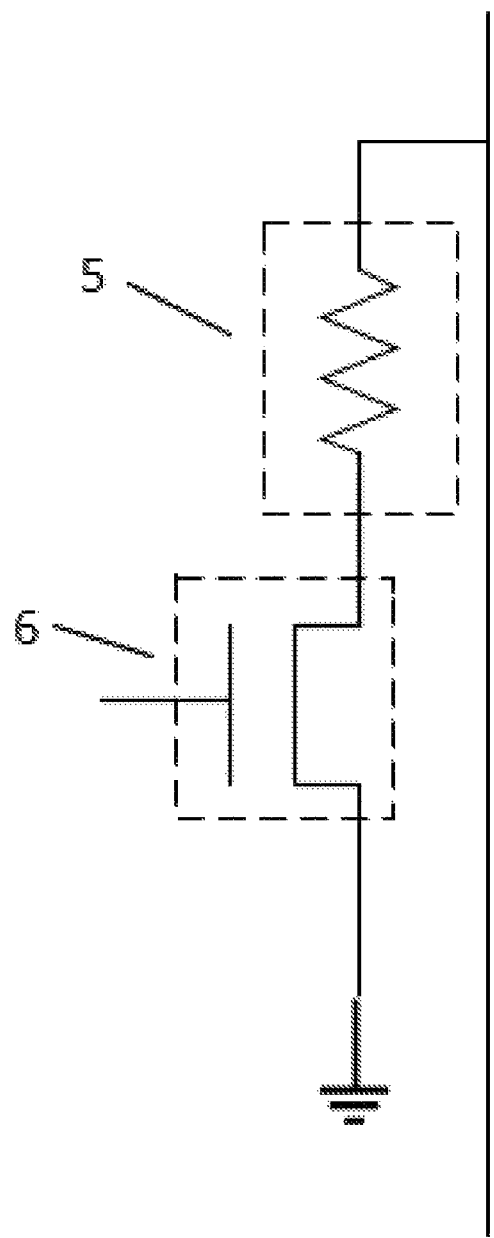
FIG. 1 is a structure diagram of a phase-change memory cell of a MOS tube in a conventional 1T1R.

In the drawings, the following reference numbers are used: 1. First electrode layer, 2. Switching layer, 3. Phase-change material layer, 4. Second electrode layer, 5. Phase-change resistor, and 6. Transistor.

DETAILED DESCRIPTION

To further illustrate, embodiments detailing a phase-change memory cell are described below. It should be noted that the following embodiments are intended to describe and not to limit the disclosure.

The disclosure provided a phase-change memory cell comprising a vanadium oxide ($VO_x$)-based switching layer. The on and off state of the $VO_x$-based switching layer can be controlled by an external voltage, thus to control the switching of the phase-change memory cell. The $VO_x$ is used as a switching material of the phase-change memory cell.

Figure 2:
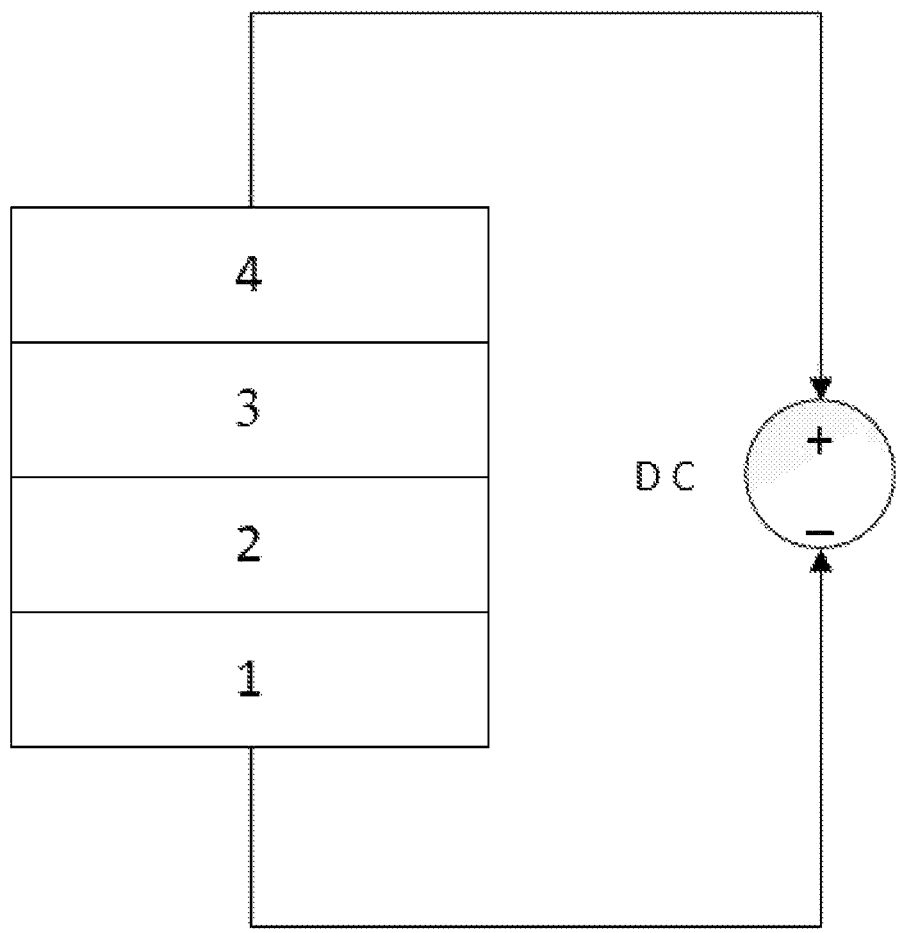
FIG. 2 is a structure diagram of a phase-change memory cell according to one embodiment of the disclosure.

As shown in FIG. 2, a phase-change memory cell, comprises, in sequence in the following order: a first electrode layer 1, a switching layer 2 comprising vanadium oxide ($VO_x$), a phase-change material layer 3 and a second electrode layer 4. When a voltage is applied to the first electrode layer and the second electrode layer, the switching layer is adapted to control the phase-change material layer to switch between in a crystalline state and in an amorphous state.

Figure 8:
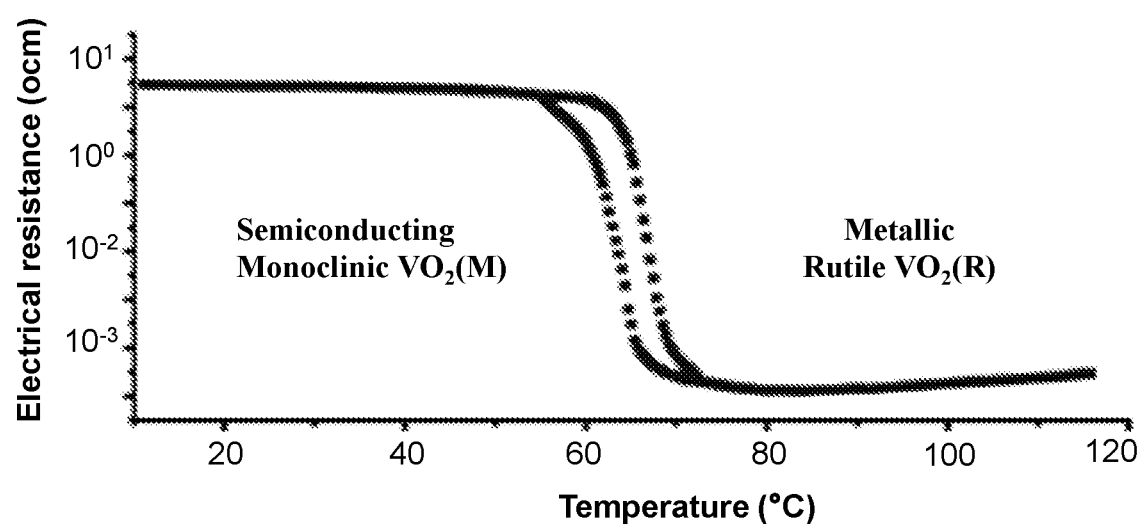
FIG. 8 is an R-T characteristic curve of a vanadium oxide ($VO_x$) material of the disclosure.

Specifically, as shown in FIG. 8, when a voltage is applied to the first electrode layer and the second electrode layer, the switching layer can switch between a high resistance state and a low resistance state. When a high-intensity electric pulse greater than a threshold voltage $V_{th}$ of the switching layer is applied, the generated heat raises the temperature of the switching layer above its phase transition temperature and therefore transform the $VO_x$ material from an insulating monoclinic crystal system to a metallic tetragonal crystal system. When an electrical pulse less than the holding voltage $V_{hold}$ id of the switching layer is applied, the temperature of the switching layer falls below the phase transition temperature and the $VO_x$ material therefore returns to high-resistance insulating state. In other words, the $VO_x$ material achieves a reversible phase transformation under thermal energy. The phase-change material layer uses its different resistance states to store data. The phase-change material layer is in a low resistance state in the presence of a write operation pulse; and the phase-change material layer is in a high resistance state in the presence of an erase operation pulse.

To prepare a $VO_x$ layer having a phase-change characteristic, a vanadium oxide thin film is first sputtered on a substrate by ion beam sputtering, DC magnetron sputtering or RF magnetron sputtering, followed by an annealing in a protective gas atmosphere such as nitrogen or argon and then naturally cooled to room temperature to obtain the $VO_x$ material. Comparing the sputtering method with the conventional evaporation method, (1) the energy of atoms deposited by the sputtering method is high, forming a dense film structure and displaying good adhesion; (2) it is easy to control the composition when preparing a $VO_x$ film; (3) metal vanadium has a melting point of 1890 ±10° C. The evaporation deposition method only evaporated vanadium at a very high base temperature, but the sputtering method is convenient for sputtering materials having high melting points. Compared with PLD method, although the PLD method has the ability to obtain high-quality films, it is difficult to form large-area and uniform films and related equipment is expensive, leading to the PLD method is not suitable for going into production, but the sputtering method is well suited. Compared with other methods: (1) the sol-gel method can form films on a large-area and non-planar substrate, while it has the difficulty in preparing a high-quality $VO_x$ film with high orientation and good switching characteristics. The produced films, whose characteristics are difficult to control and the density is inferior, is easy to have defects such as bubbles or cracks, and easy to cause pollution; (2) due to the use of noble gases and toxic gases, chemical vapor deposition is harmful to the health of workers and unfavorable to environmental protection; (3) equipment used for molecular beam epitaxy and atomic layer deposition are relatively expensive and difficult to operate, which is not conducive to mass and industrial production.

Figure 3:
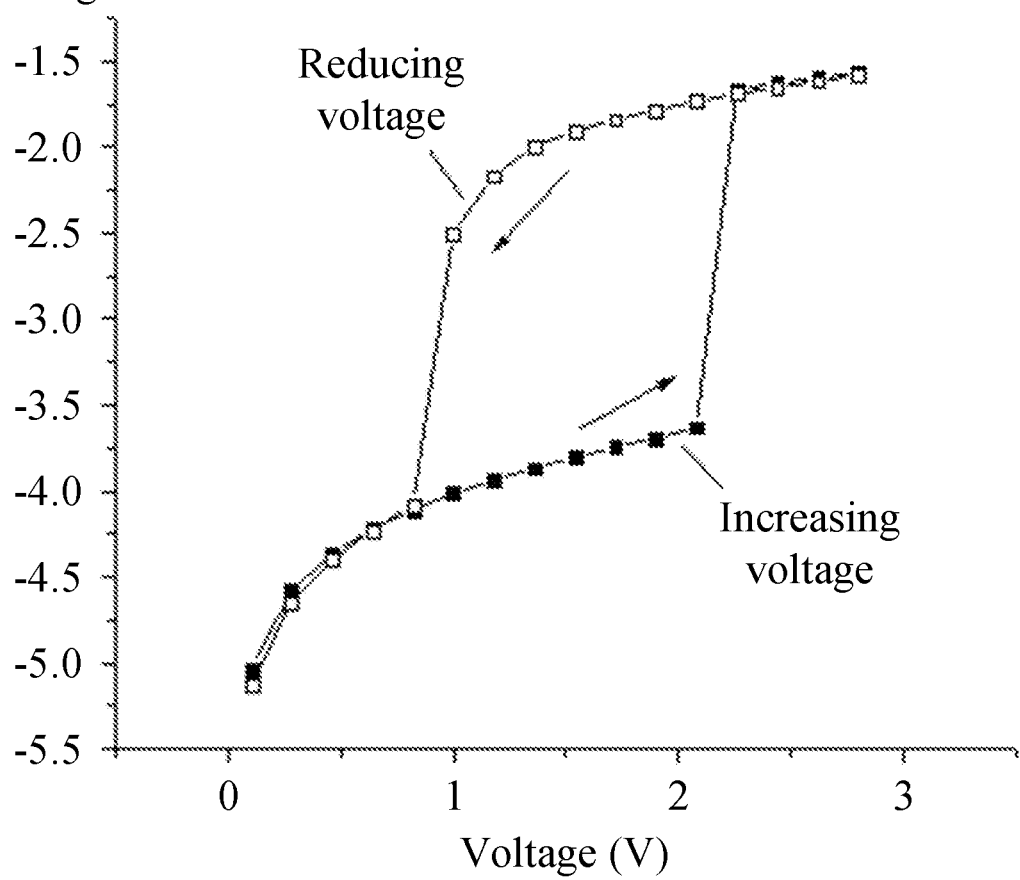
FIG. 3 is an I-V characteristic curve of a vanadium oxide ($VO_x$) material of the disclosure, which comprises a step-up curve and a step-down curve showing the current variation of a phase-change memory cell according to one embodiment of the disclosure.

FIG. 3 is a graph showing a V-I curve of a $VO_x$ layer. Gradually increasing the applied voltage on the VON, when the voltage reaches to the threshold voltage $V_{th}$, the current through the $VO_x$ sharply increases, and the $VO_x$ changes from a semiconducting high resistance state to a metallic low resistance state. The switching layer is thus turned on. Conversely, gradually reducing the applied voltage on the $VO_x$, when the voltage reduces to the holding voltage $V_{hold}$, the current through the $VO_x$ sharply reduces, and the $VO_x$ returns to the semiconducting high resistance state. The switching layer is thus closed.

The phase-change memory cell uses a 1D1R structure without a transistor, and is smaller in size and more advantageous for the 3D stacking compared with 1T1R structure. The preparation process of the $VO_x$ comprises sputtering and annealing at room temperature, which is simple and low-cost compared with diodes prepared at high temperatures. The threshold voltage of the $VO_x$ is much less than the phase-change threshold voltage $V_{pc}$ of the phase-change cell, leading to a larger operation window for the phase-change memory cell. The on-off current ratio of the $VO_x$ is up to $10^4$. This can reduce the leakage current and provide a large drive current.

Figure 4:
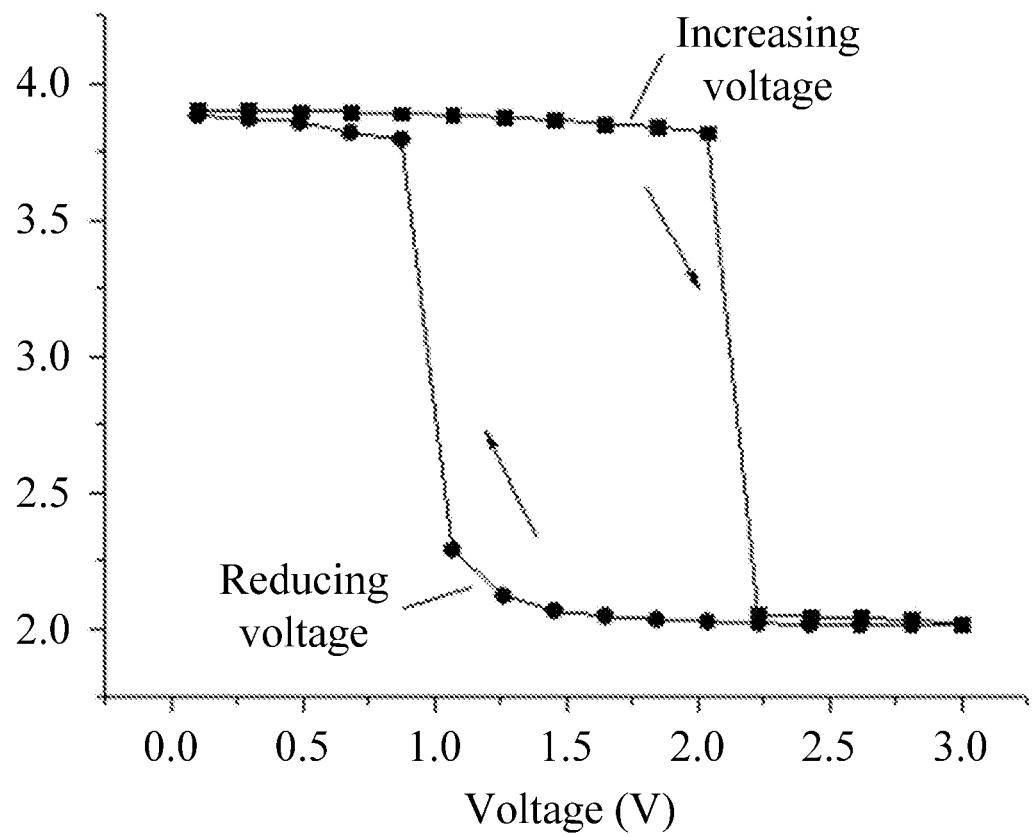
FIG. 4 is an R-V characteristic curve of a vanadium oxide ($VO_x$) material of the disclosure, which comprises a step-up curve and a step-down curve showing the resistance variation of a phase-change memory cell according to one embodiment of the disclosure.

FIG. 3 shows a typical I-V characteristic curve of the $VO_x$ material, and FIG. 4 is a typical R-V curve. The two figures show that the $VO_x$ changes from high resistance to low resistance when an applied voltage on the $VO_x$ reaches to 2.2 V, and the ratio of the on-state current to the off-state current is close to three orders of magnitude, which is called a threshold voltage Vth.

In certain examples of the disclosure, the threshold voltage $V_{th}$ of the $VO_x$ is related to the specific parameters of the $VO_x$ preparation process. The value of the threshold voltage $V_{th}$ is positively correlated with the oxygen concentration during the sputtering process of the $VO_x$, but the size of the switching layer is negatively correlated with the threshold voltage $V_{th}$.

In certain examples of the disclosure, the insulation resistance of the $VO_x$ material is larger than the resistance in the metallic state, and the ratio of the insulation resistance to the resistance in the metallic state is greater than 100, especially greater than 10000. The ratio of the two resistance is related to the specific parameters in the preparation process, and the resistance ratio decreases as the oxygen concentration increases. The resistance is also related to the size of the $VO_x$ layer, the smaller the size, the smaller the on-off resistance of the switching layer, and the larger the on-off current ratio. Therefore, the phase-change memory cell has better switching properties in a small-sized and high-density memory array.

In certain examples of the disclosure, the phase-change temperature of the $VO_x$ material is about 68° C., especially from 60° C. to 80° C.

Figure 5:
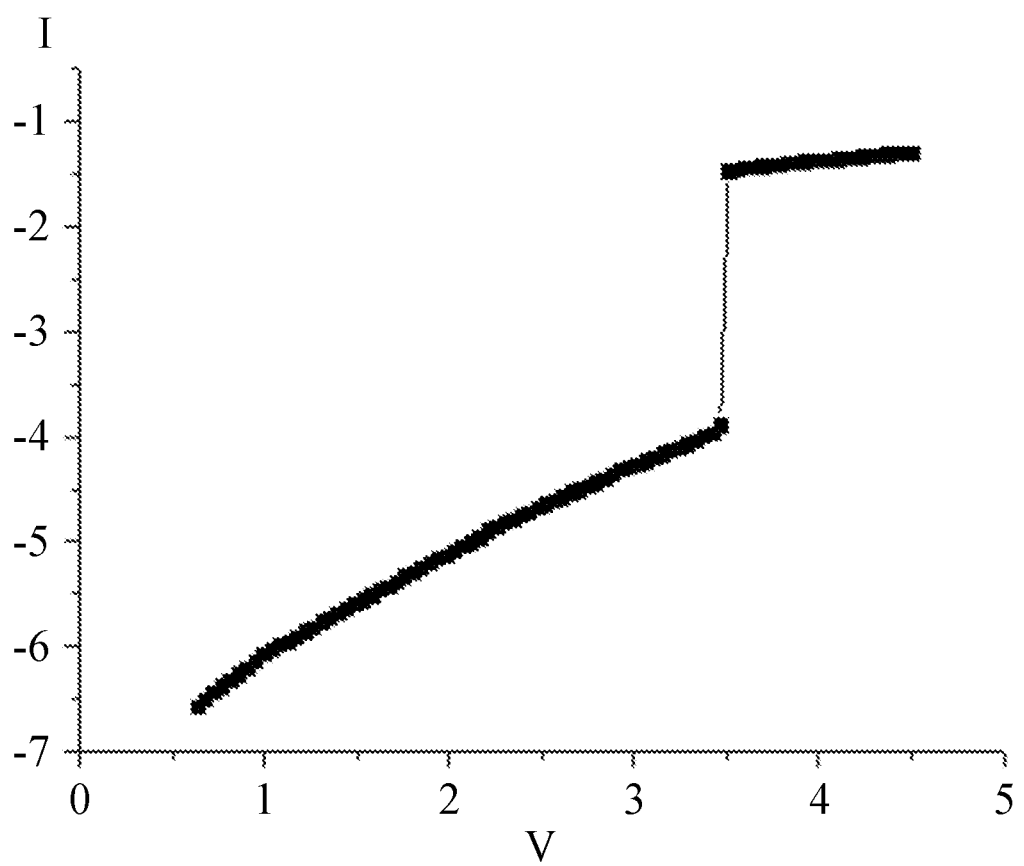
FIG. 5 is an I-V characteristic of a phase-change memory cell without a vanadium oxide-based switching layer.

FIG. 5 shows a typical I-V characteristic curve of phase-change material GeSbTe (GST). The figure shows that when the applied voltage reaches to the phase-change voltage $V_{Set}$ of the phase-change material, the heat generated by the phase-change material can rise beyond the crystallization temperature. Hold the temperature for an atomic relaxation time, the material changes from a disordered amorphous state to an ordered crystalline state.

In certain examples of the disclosure, the ratio of the amorphous resistance to the crystalline resistance is larger than 10, especially greater than 100,000.

In certain examples of the disclosure, the phase-change voltage $V_{Set}$ of the phase-change material is related to the doping concentration of the phase-change material. To improve the phase transition voltage $V_{Set}$ of the phase-change cell, the phase-change material is doped with N and Si.

Figure 6:
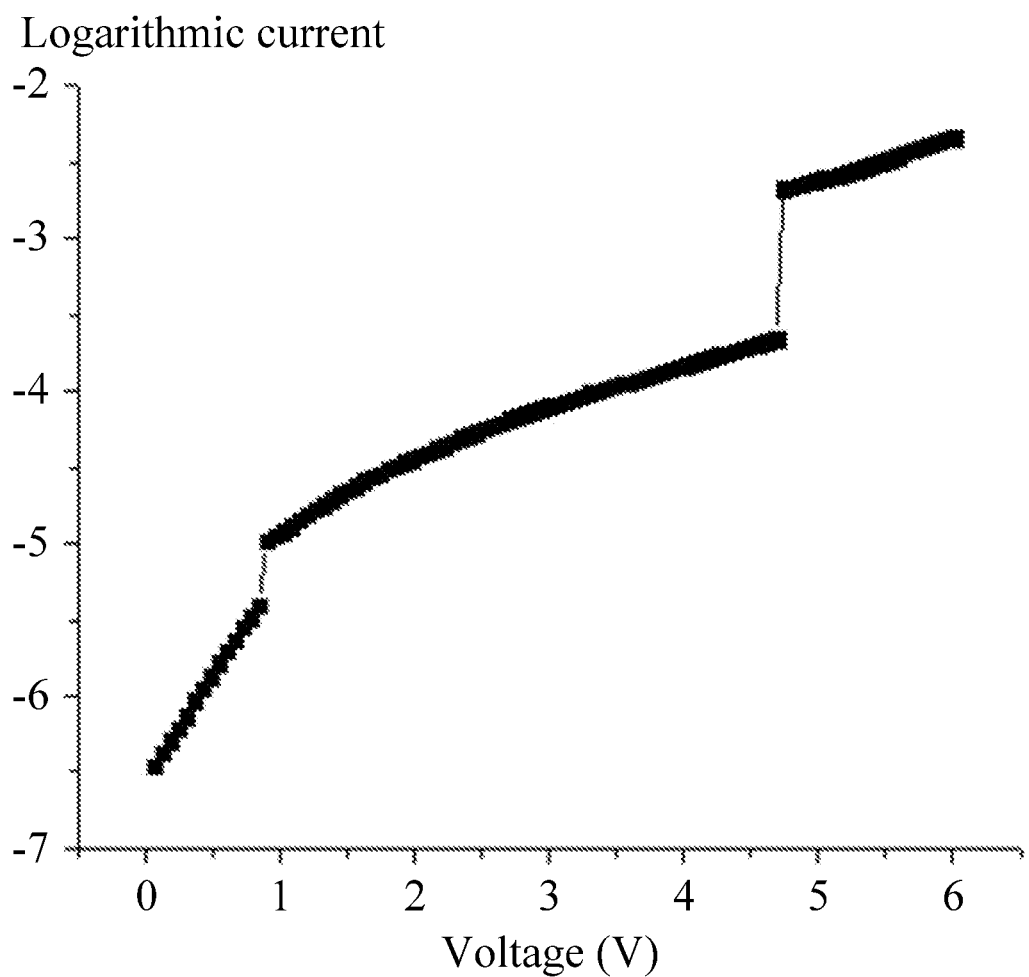
FIG. 6 is an I-V characteristic curve of a phase-change memory cell according to one embodiment of the disclosure.

FIG. 6 shows an I-V characteristic curve of the phase-change memory cell. The current increases as the applied voltage gradually increases from zero, and the current sharply jumps when the applied voltage reaches to the threshold voltage $V_{th}$, indicating that the $VO_x$ changes from off-state to on-state, the overall resistance sharply reduces and the switching layer is thus turned on. With the switching layer being on, gradually increases the applied voltage, the circuit jumps sharply once again when the applied voltage reaches to the phase-change voltage $V_{Set}$. Because the applied voltage reaches to the phase-change voltage of the phase-change material GST, the GST changes from an amorphous state to a crystalline state and the resistance is reduced, realizing the erase operation of the phase-change memory cell. In addition, the threshold voltage $V_{th}$ of the switching layer is much less than the phase-change voltage $V_{Set}$ of the phase-change cell, leading to a larger operation windows for the phase-change cell.

Figure 7:
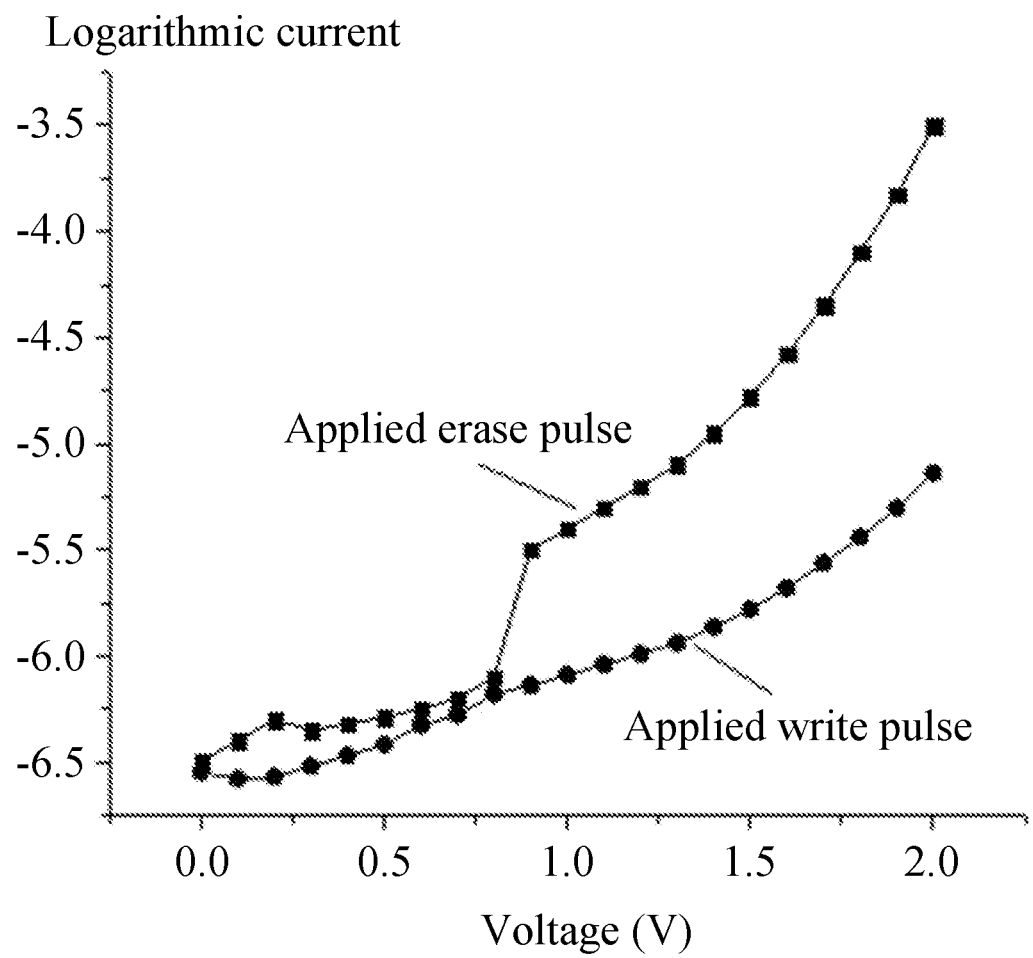
FIG. 7 is a graph showing the function testing of a phase-change memory cell according to one embodiment of the disclosure.

FIG. 7 shows a graph showing the function testing of the phase-change memory cell. To study the read function of TiWGST/$VO_2$/TiW, an erase pulse (setting pulse) is applied to the cell. The erase pulse having an amplitude of 6 V and a pulse width of 500 ns is applied considering the phase-change voltage of GST is 4.6 V. Comparing the two curves in the figures, the scanning voltage ranges from 0-2V, and GST changes from an amorphous state to a crystalline state after applying the erase pulse. The storage state can be distinguished by the resistance value as long as read voltage is slightly larger than the threshold voltage (0.9V).

It will be obvious to those skilled in the art that changes and modifications may be made, and therefore, the aim in the appended claims is to cover all such changes and modifications.

What is claimed is:

1. A device, comprising, in sequence in the following order:
   1) a first electrode layer;
   2) a switching layer comprising vanadium oxide ($VO_x$) material;
   3) a phase-change material layer; and
   4) a second electrode layer;
   wherein: the switching layer is adapted to control the phase-change material layer to switch between a crystalline state and an amorphous state when a voltage is applied to the first electrode layer and the second electrode layer,
   wherein the device is configured to
   1) apply an electric pulse greater than a threshold voltage Vth of the switching layer between the first electrode layer and the second electrode layer, so that a temperature of the switching layer rises to be higher than its phase transition temperature, and the VOx material switches from a monoclinic crystal system in an insulating state to a tetragonal crystal system in a metallic state:
   2) apply an electric pulse less than a holding voltage $VoI_d$ of the switching layer between the first electrode layer and the second electrode layer, so that the temperature of the switching layer decreases to be lower than its phase transition temperature, and the VOx material returns to the monoclinic crystal system in the insulating state;
   3) apply a resetting pulse having a voltage greater than a write operation threshold voltage $V_{Reset}$ and a falling edge of 10 ns between the first electrode layer and the second electrode layer, so that the temperature of the phase-change material layer rises beyond melting temperature, the long-range order of the crystalline state is destroyed, and the phase-change material rapidly cools down below the crystallization temperature under the falling edge;
   there is no time for the phase-change material to crystallize; the phase-change material is in the amorphous state, and the phase-change material layer is in a low resistance state, to achieve a write operation; and
   4) apply a setting pulse having a voltage between the phase transition voltage $V_{set}$ of the phase-change material layer and the write operation threshold voltage $V_{Reset}$ and a pulse width of 200 ns between the first electrode layer and the second electrode layer, so that the temperature of the phase-change material rises between the crystallization temperature and the melting temperature for 200 ns to ensure the crystallization of the phase-change material; the phase-change material changes from an amorphous state to a crystalline state, and the phase-change material layer is in a high resistance state, to achieve an erase operation.

2. The device of claim 1, wherein the phase-change material layer comprises a compound selected from GeTe, SbTe, BiTe, SnTe, AsTe, GeSe, SbSe, BiSe, SnSe, AsSe, InSe, GeSbTe, and AgInSbTe, or a mixture of the compound and a dopant selected from S, N, O, Cu, Si and Au.

3. The device of claim 1, wherein the first electrode layer and the second electrode layer comprise TiW, Pt, Au, W or an inert electrode.

4. The device of claim 2, wherein the first electrode layer and the second electrode layer comprise TiW, Pt, Au, W or an inert electrode.

5. The device of claim 1, wherein X of the $VO_x$ material ranges from 1.9 to 2.1.

6. The device of claim 2, wherein X of the $VO_x$ material ranges from 1.9 to 2.1.

7. The device of claim 3, wherein X of the $VO_x$ material ranges from 1.9 to 2.1.

8. The device of claim 4, wherein X of the $VO_X$ material ranges from 1.9 to 2.1.

9. The device of claim 1, wherein a threshold voltage of the switching layer is less
than a phase transition voltage $V_{set}$ of the phase-change material layer.

10. The device of claim 2, wherein a threshold voltage of the switching layer is less than a phase transition voltage $V_{set}$ of the phase-change material layer.

11. The device of claim 8, wherein a threshold voltage of the switching layer is less than a phase transition voltage $V_{set}$ of the phase-change material layer.

12. The device of claim 1, wherein an area of the switching layer is 100 $nm^2$-30 $\mu m^2$.

13. The device of claim 2, wherein an area of the switching layer is 100 $nm^2$-30 $\mu m^2$.

14. The device of claim 11, wherein an area of the switching layer is 100 $nm^2$-30 $\mu m^2$.

15. The device of claim 1, wherein an insulation resistance of the $VO_X$ material of the switching layer is greater than a resistance thereof in the metallic state, and the ratio of the insulation resistance to the resistance in the metallic state is greater than 60.

16. The device of claim 2, wherein an insulation resistance of the $VO_x$ material of the switching layer is greater than a resistance thereof in the metallic state, and the ratio of the insulation resistance to the resistance in the metallic state is greater than 60.

17. The device of claim 14, wherein an insulation resistance of the $VO_x$ material of the switching layer is greater than a resistance thereof in the metallic state, and the ratio of the insulation resistance to the resistance in the metallic state is greater than 60.

18. An operation method of the device of claim 1, the method comprising:
1) applying an electric pulse greater than a threshold voltage $V_{th}$ of the switching layer between the first electrode layer and the second electrode layer, so that a temperature of the switching layer rises to be higher than its phase transition temperature, and the $VO_x$, material switches from a monoclinic crystal system in an insulating state to a tetragonal crystal system in a metallic state;
2) applying an electric pulse less than a holding voltage $V_{hold}$ of the switching layer between the first electrode layer and the second electrode layer, so that the temperature of the switching layer decreases to be lower than its phase transition temperature, and the $VO_x$ material returns to the monoclinic crystal system in an insulating state;
3) applying a resetting pulse having a voltage greater than a write operation threshold voltage $V_{Reset}$ and a falling edge of 10 ns between the first electrode layer and the second electrode layer, so that the temperature of the phase-change material layer rises beyond the melting temperature, the long-range order of the crystalline state is destroyed, and the phase-change material rapidly cools down below the crystallization temperature under the falling edge; there is no time for the phase-change material to crystallize; the phase-change material is in an amorphous state, and the phase-change material layer is in a low resistance state, to achieve a write operation; and
4) applying a setting pulse having a voltage between the phase transition voltage $Vse_t$ of the phase-change material layer and the write operation threshold voltage $V_{Reset}$ and a pulse width of 200 ns between the first electrode layer and the second electrode layer, so that the temperature of the phase-change material rises between the crystallization temperature and the melting temperature for 200 ns to ensure the crystallization of the phase-change material; the phase-change material changes from an amorphous state to a crystalline state, and the phase-change material layer is in a high resistance state, to achieve an erase operation.

19. The method of claim 18, wherein the threshold voltage $V_{th}$ of the switching layer is less than the phase transition voltage $Vse_t$ of the phase-change material layer.

20. A method for preparing the switching layer of the device of claim 1, the method comprising: forming a layer of vanadium oxide by ion beam sputtering or magnetron sputtering, annealing the layer of vanadium oxide in a nitrogen or argon atmosphere, and cooling to room temperature to obtain the switching layer.

* * * * *